United States Patent [19]

Shirai et al.

[11] Patent Number: 4,878,096

[45] Date of Patent: Oct. 31, 1989

[54] SEMICONDUCTOR DEVICE IC WITH DMOS USING SELF-ALIGNED BACK GATE REGION

[75] Inventors: Koji Shirai; Ken Kawamura, both of Yokohama, Japan

[73] Assignee: Kabushiki Kaisha Toshiba, Kawasaki, Japan

[21] Appl. No.: 27,406

[22] Filed: Mar. 18, 1987

[30] Foreign Application Priority Data

Mar. 28, 1986 [JP] Japan ............................ 61-68702

[51] Int. Cl.[4] ............................................. H01L 27/02
[52] U.S. Cl. ..................................... 357/42; 357/23.4; 357/23.9; 357/41; 357/48
[58] Field of Search ................ 357/42, 23.4, 47, 23.1, 357/23.9, 357/48, 357/50, 357/41

[56] References Cited

U.S. PATENT DOCUMENTS

| | | | |
|---|---|---|---|
| 4,403,395 | 9/1983 | Curran | 29/571 |
| 4,626,882 | 12/1986 | Cottrell et al. | 357/42 |
| 4,628,341 | 12/1986 | Thomas | 357/42 |

FOREIGN PATENT DOCUMENTS

| | | |
|---|---|---|
| 0158292 | 10/1985 | European Pat. Off. |
| 52-15277 | 2/1977 | Japan ............................ 357/48 |
| 52-67580 | 6/1977 | Japan ............................ 357/48 |
| 59-215766 | 12/1984 | Japan . |
| 62-130552 | 6/1987 | Japan ............................ 357/48 |

OTHER PUBLICATIONS

Goodenough, "With Better Isolation, Power ICs Unite Small-Signal and Large-Signal Devices", *Electronic Design*, Sep. 5, 1985, pp. 113-121.
Kohyama et al., "Directions in CMOS Technology", *IEEE Int'l. Electron Devices Meeting 1983*, Wash., DC, Dec. 5-7, 1983, pp. 151-154.
OHR, "DMOS-CMOS Process Points to Highest Power Rating for Smart Power Control", *Electronic Design*, Feb. 9, 1984, vol. 32, No. 3, pp. 37-38.
Parker, "Power and Logic Devices are Merging on the Same Chip", Computer Design, pp. 29-35, Aug. 1984.
Krishna et al., "An Analog Technology Integrates Bipolar, CMOS, and High-Voltage DMOS Transistors", IEEE Transactions on Electron Devices, vol. ED-31, No. 1, pp. 89-95, Jan. 1984.
Electronic Design, vol. 32, (1984), Feb., No. 3, Waseca, MN, NJ.
Patent Abstracts of Japan, vol. 9, No. 85, (E-308) (1808) 4/13/85.
Electronic Design, vol. 33, (1985), Sep., No. 21, Hasbrouck Heights, NJ, International Electron Devices Meeting, Technical Digest.

*Primary Examiner*—William Mintel
*Attorney, Agent, or Firm*—Finnegan, Henderson, Farabow, Garrett, and Dunner

[57] ABSTRACT

In a semiconductor device according to the present invention, a pair of element regions of a second conductivity type are formed so as to be electrically isolated from each other on a semiconductor substrate of a first conductivity type, a complementary MOS transistor is formed in one of the element regions of the second conductivity type, and a double-diffused MOS transistor is formed in the other element region of the second conductivity type. The complementary MOS transistor is of a surface channel type in which N- and P-channel MOS transistors are respectively formed in a pair of well diffusion layers of the first and second conductivity types formed in the element region of the second conductivity type, and conductivity types of the respective gate electrodes of the N- and P-channel MOS transistors are different from those of the respective well diffusion layers. The double-diffused MOS transistor is of a surface channel type in which a back gate region is formed so as to be self-aligned with the gate electrode and the conductivity type of the gate electrode is different from that of the well diffusion layer.

8 Claims, 7 Drawing Sheets

F I G. 3
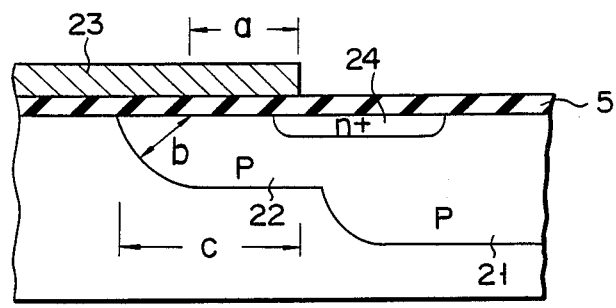
F I G. 4A
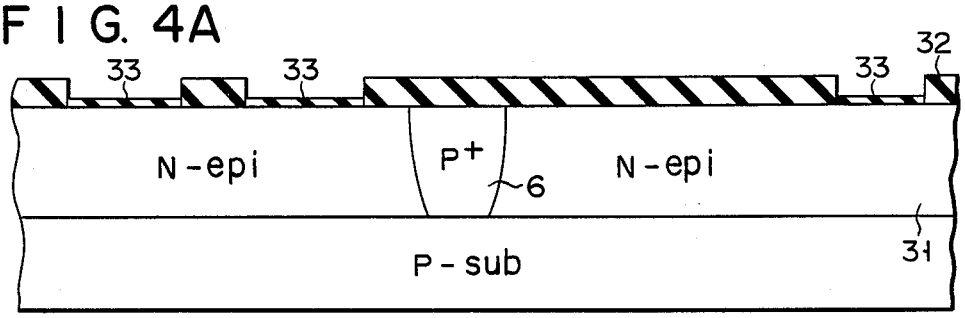
F I G. 4B
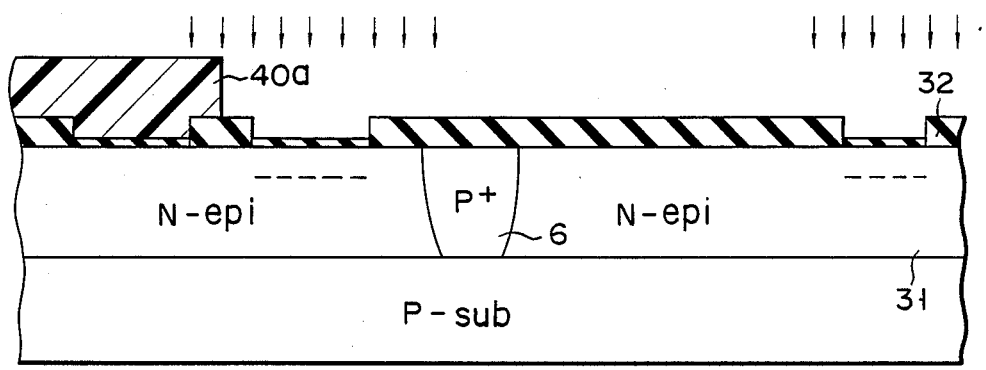
F I G. 4C
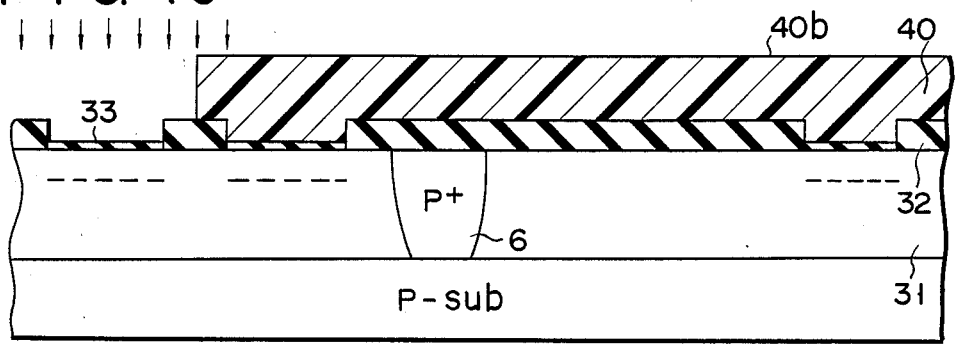

SEMICONDUCTOR DEVICE IC WITH DMOS USING SELF-ALIGNED BACK GATE REGION

BACKGROUND OF THE INVENTION

The present invention relates to a semiconductor device having a complementary MOS transistor and a double-diffused MOS transistor on a single semiconductor substrate, and a method of manufacturing the same.

A semiconductor device having a complementary MOS transistor (to be referred to as a C-MOS hereinafter) and a double-diffused MOS transistor (to be referred to as a D-MOS hereinafter) on a single substrate has been anticipated as a power IC with a high speed logic since a lower power consumption logic circuit can be constituted at the C-MOS and a high output can be obtained from the D-MOS.

FIG. 1 is a sectional view of an example of a conventional semiconductor device which consists of the above-mentioned C-MOS and D-MOS. In FIG. 1, N-type epitaxial silicon layer 2 is formed on P-type silicon substrate 1, and P+-type isolation diffusion layer 3 is formed in layer 2 from its surface to substrate 1, so that element regions for C-MOS and D-MOS are isolated. C-MOS 10 and D-MOS 20 are respectively formed in the isolated element regions. Gate electrodes of C-MOS 10 and D-MOS 20 consist of a polycrystalline silicon layer which is doped with high concentration phosphorus to have a low resistance. Reference numeral 4 denotes a field oxide film.

The above conventional semiconductor device is manufactured as shown in FIGS. 2A to 2C.

First, by a process normally performed in manufacturing a bipolar semiconductor device, layer 2 is formed, and then layer 3 is formed to isolate respective element regions. Subsequently, C-MOS 10 and D-MOS 20 are formed in the respective element regions. That is, using the process performed in normal C-MOS processes, P-type well region 11 for an n-channel MOS transistor (to be referred to as an N-MOS hereinafter) is formed in the element region of C-MOS 10. At the same time, P-type well region 21 for withstand voltage compensation is formed in the element region for D-MOS 20. P-type back gate region 22 of D-MOS 20 is formed first, and field oxide film 4 is formed second. Then, after the field oxide film of the element region is removed so as to expose a surface of the epitaxial silicon layer, the exposed surface is thermally oxidized to form gate oxide film 5. Thereafter, polycrystalline silicon layer 6, as a gate electrode material, is deposited on the entire surface.

Then, phosphorus is diffused in high concentration in layer 6 using POCl$_3$ as a diffusion source, so that layer 6 has a sufficiently low resistance to serve as a gate electrode (FIG. 2A).

Subsequently, layer 6 is patterned to form gate electrodes 12 and 13 of C-MOS 10 and gate electrode 23 of D-MOS (FIG. 2B).

Then, by ion-implanting arsenic, n+- type source region 14 and drain region 15 of the N-MOS are formed, and at the same time, n+-type source region 24 and n+-type drain region 25 of D-MOS 20 are formed. Subsequently, boron is ion-implanted to form p+-type source region 16 and drain region 17 of the P-MOS. After CVD-SiO$_2$ film 7 is deposited as an insulating interlayer, a contact hole is opened, and aluminum is deposited and patterned to form aluminum wiring 8, such as source and drain electrodes of C-MOS 10 and D-MOS 20 (FIG. 2C).

It should be noted that gate electrodes 12, 13, and 23 in the above conventional semiconductor device are all n-type, because they are doped with phosphorus to obtain a low resistance. Therefore, boron is counter-doped in a P-MOS channel region constituting C-MOS 10 to obtain a transistor of a so-called buried channel type for the following reason. That is, since both the channel region of the P-MOS and the gate electrode are n-type, a work function difference between them is too small to invert the channel region, and it is difficult to obtain a threshold voltage of 1 V or less by the P-MOS consisting of a normal gate oxide film. Thus, counter doping is performed to obtain a lower threshold voltage.

In addition, in the manufacture of a conventional semiconductor device, since P-type back gate electrode region 22 of D-MOS 20 is formed before the formation of gate electrode 23, a mask alignment margin between them must be made. That is, as shown in FIG. 3, length c of the back gate region of D-MOS 20 must be longer by length a of the above mask alignment margin than length b obtained when the region is formed by self-alignment. For this reason, an element size is increased to prevent high packing density, and an ON resistance is increased by an elongated amount of the channel region of D-MOS 20. For example, when mask alignment accuracy is within 1 $\mu$m, alignment margin a of 2 $\mu$m or more must be made for n+-type source region 24 to be formed later. Since a diffusion length (b) of region 22 is normally 4 $\mu$m, the ON resistance in this case is increased by 75% as compared with the case in which the region is formed by the self-alignment method.

Despite the above disadvantages, the self-alignment method is not used in the formation of region 22 of D-MOS 20 for the following reason.

That is, in order to form region 22 by self-alignment, boron is ion-implanted using electrode 23 as a blocking mask and then diffused and activated by annealing at a high temperature for a long period of time. However, since electrodes 12, 13, and 23 are already doped with high concentration phosphorus, the phosphorus in electrodes 12, 13, and 23 is diffused to reach epitaxial silicon layer 2, if such annealing is performed at a high temperature for a long period of time. For this reason, controllability of gate threshold voltage Vth is significantly degraded in D-MOS 20 and C-MOS 10, and it is particularly impossible to form a MOS transistor.

Another reason why the self-alignment methed is not adopted in the formation of region 22 in D-MOS 20 is that the P-MOS constituting C-MOS 10 must be of a buried channel type for the above reason.

More specifically, like so-called channel-implantation, boron must be counter-doped to form p+-type source region 16 and drain region 17 of the P-MOS before polycrystalline silicon layer 6 for gate electrodes 12 and 13 is formed. The term "channel-implementation" means ion-implantation of an impurity in a channel region to control the threshold voltage, because the impurity is segregated into gate oxide film 5 when the film is formed. Accordingly, when the self-alignment method is adopted for formation of region 22, high temperature annealing must be performed after counter doping. Furthermore, since the impurity concentration of layer 2 is lower than that of normal C-MOS 10 with D-MOS 20, to increase a withstand voltage of D-MOS 20, counter-doped boron is diffused deep into layer 2 by the above annealing. As a result, since a p-n junction is formed in a channel region much deeper than that in a normal buried channel type, it is either impossible or very difficult to form the P-MOS.

In addition, due to the above reason, it is difficult for C-MOS 10 to have a satisfactory complementary operation characteristic in a conventional semiconductor device because the P-MOS constituting C-MOS 10 is of a buried channel type.

SUMMARY OF THE INVENTION

It is an object of the present invention to provide, when a C-MOS and a D-MOS are integrated on a single substrate, a structure capable of satisfactorily maintaining the characteristics required for the respective elements even when a back gate region of the D-MOS is formed by self-alignment, and an economical and efficient method of manufacturing the same.

In the present invention, gate electrodes of the C-MOS and the D-MOS are not doped with an impurity of the same conductivity type but with impurities used to form respective source and drain regions so as to have a low resistance. Accordingly, the C-MOS and the D-MOS need not be a buried channel type, but both the C-MOS and the D-MOS have a surface channel structure.

That is, in the semiconductor device according to the present invention, a pair of element regions of a second conductivity type are formed so as to be electrically isolated from each other on a semiconductor substrate of a first conductivity type, well diffusion layers of the first and second conductivity types are formed in one of the pair of element regions of the second conductivity type, n- and p-channel MOS transistors are respectively formed in the well diffusion layers of the first and second conductivity types to constitute a C-MOS, and D-MOS is formed in the other of the above pair of element regions of the second conductivity type, a conductivity type of gate electrode of the above MOS transistors of three types is the same as that of source and drain regions of the respective transistors so as to obtain a surface channel structure, and a back gate region of the D-MOS is formed so as to be self-aligned with the gate electrode constituting the D-MOS.

In the present invention, it is preferable to use a twin well system for the C-MOS. That is, well diffusion layers of first and second conductivity types are formed in one of the above element regions of the first conductivity type, and n- and p-channel MOS transistors are respectively formed by a p-type (first conductivity type) well region and an n-type (second conductivity type) well region.

In addition, a so-called refill epitaxial growth structure in which the above element region of the second conductivity type is formed in an epitaxial layer buried in the semiconductor substrate may be adopted. That is, in this case, a prospective element region of the above semiconductor substrate of the first conductivity type is etched deep by isotropic etching to form a pair of recesses, high concentration diffusion layers of the second conductivity type are respectively formed on surfaces of the pair of recesses, and a semiconductor layer having an impurity concentration lower than that of the high concentration diffusion layer of the second conductivity type selectively epitaxially grown on the recess surface is used as the above-mentioned element region of the second conductivity type.

In the manufacturing method according to the present invention, an undoped polycrystalline silicon layer is deposited for gate electrodes of a C-MOS and a D-MOS, and is then patterned to form gate electrodes of a P-MOS and an N-MOS constituting the C-MOS and a gate electrode of the D-MOS. Then, an impurity of the first conductivity type is ion-implanted in an element region of the D-MOS using an end of the gate electrode of the D-MOS as a blocking mask. Annealing at a high temperature is performed to cause slumping, so that a back gate region of the first conductivity type is formed by self-alignment. At the same time, a polycrystalline silicon layer constituting respective gate electrodes is annealed. However, in this stage, the respective gate electrodes are still undoped. Therefore, when the respective source and drain regions are to be formed, the same impurity is doped in each gate electrode to obtain low resistance. Accordingly, the gate electrode of the P-MOS constituting the C-MOS is p-type (a channel region is n-type), and the gate electrode of the N-MOS is n-type (a channel region is p-type).

As described above, in the semiconductor device according to the present invention, a C-MOS and a D-MOS are formed in a single substrate, and conductivity types of polycrystalline silicon gate electrodes of the P-MOS and the N-MOS which constitute the C-MOS oppose those of the respective channel regions thereof. For this reason, both the MOS transistors constituting the C-MOS are of a surface channel type. Therefore, a well-balanced and satisfactory complementary operation characteristic can be obtained. In addition, since counter doping need not be performed for the C-MOS, a process of forming a back gate region of the D-MOS by self-alignment can be adopted without degrading the characteristic of the C-MOS to be described later.

In the manufacturing method according to the present invention, unlike in the conventional method, no mask alignment margin is required because the back gate region of the D-MOS is formed by self-alignment, thereby contributing to improvements in micropatterning of elements and high packing density. In this self-alignment process, an impurity ion-implantation using the gate electrode of the D-MOS as a mask is slumped, and annealing is performed at a high temperature for a long period of time to form the back gate region. However, because the gate electrodes of both the D-MOS and the C-MOS are still undoped in this stage, a conventional problem in which the impurity in the gate electrode is diffused through the gate oxide film to disable threshold value control of the MOS transistor can be eliminated. In addition, according to the present invention, since both the MOS transistors constituting the C-MOS are of a surface channel type, counter doping is not required. Accordingly, even when annealing is performed at a high temperature for a long period of time, a conventional problem does not occur in which the counter-doped impurity is diffused too deep to disable operation of the MOS transistor of a buried channel type. On the other hand, since an impurity with a high concentration is not doped in the polycrystalline silicon layer which serves as the gate electrode as described above, a means for forming the gate electrode with a very low resistance is important in the present invention. For this purpose, in the present invention, when an impurity is doped using respective gate electrodes as masks to form source and drain regions of the C-MOS and the D-MOS by self-alignment, the same impurity is doped in the gate electrode, thereby achieving the above object. This is because, in the present invention, the polycrystalline silicon layer is annealed by high temperature annealing which is performed when the above D-MOS channel region is formed, and crystal grains are grown to reduce a potential barrier of intergranular boundaries, so that the gate electrode has a very low resistance by doping the impurity during source and drain diffusion.

The above method of forming the gate electrode with a low resistance according to the present invention is not carried out if the gate electrode is not annealed as in the conventional method. That is, since the gate electrode cannot have enough conductivity by the dose applied in a normal source/drain diffusion, the concentration in the source/drain diffusion must be significantly increased to obtain enough conductivity, resulting in a long diffusion length. Especially, since boron normally used as a P-type impurity has a large diffusion coefficient, not only is micropatterning of the P-MOS prevented, but also a short channel effect significantly appears. Thus, the manufacturing method according to the present invention effectively utilizes annealing at a high temperature for a long period of time for forming the back gate region of the D-MOS by self-alignment, i.e., the step which has been an obstacle in adopting a self-alignment process in a conventional method, thereby achieving the above method of obtaining a low resistance.

BRIEF DESCRIPTION OF THE DRAWINGS

FIGS. 2A to 2C are sectional views of a process of manufacturing the conventional semiconductor device consisting of the C-MOS and the D-MOS as shown in FIG. 1, in which:

FIG. 2A is a sectional view in which a P-type well region is formed in an element region of the C-MOS, a P-type region is formed in an element region of the D-MOS, a field oxide film is formed, a portion of an element region of the field oxide film is removed, a surface of an epitaxial silicon layer is exposed and thermally oxidized to form a gate oxide film, and then a polycrystalline silicon layer, as a gate electrode material, is deposited;

FIG. 2B is a sectional view in which phosphorus is diffused at high concentration in the polycrystalline silicon layer and then patterned to form gate electrodes of the C-MOS and the D-MOS;

FIG. 2C is a sectional view in which arsenic is ion-implanted to form n+-type source and drain regions of the N-MOS and n+-type source and drain regions of the D-MOS, boron is ion-implanted to form p+-type source and drain regions of the P-MOS, a CVD-SiO$_2$ film is deposited, and then source electrodes, drain electrodes, and aluminum wirings of the C-MOS and the D-MOS are formed;

FIG. 3 is a sectional view showing a length of a channel region of the D-MOS according to the conventional method of manufacturing a semiconductor device as shown in FIGS. 2A to 2C;

FIGS. 4A to 4O are sectional views of a process of manufacturing a semiconductor device, in which, FIG. 4A is a sectional view in which a surface of an epitaxial silicon layer is oxidized to form a thermal oxide film, a P-MOS formation portion, an N-MOS formation portion of the C-MOS element region and a withstand voltage compensation region formation portion of the D-MOS element region are opened by photolithography, and the exposed surface of the epitaxial silicon layer is thermally oxidized to form a buffer oxide film;

FIG. 4B is a sectional view in which the P-MOS formation portion is covered with a resist pattern and boron is ion-implanted in the N-MOS formation portion and the withstand voltage compensation region formation portion of the D-MOS using the resist pattern and the thermal oxide film as blocking masks;

FIG. 4C is a sectional view in which the N-MOS formation region and the withstand voltage compensation region formation portion of the D-MOS are covered with a resist pattern and phosphorus is ion-implanted in the P-MOS formation portion using the resist pattern and the thermal oxide film as blocking masks;

FIG. 4O is a sectional view in which a contact hole is opened, aluminum is deposited and patterned to form an A1 wiring, and then a phosphosilicate glass film is deposited on the entire surface;

PREFERRED EMBODIMENTS OF THE INVENTION

Figure 1:
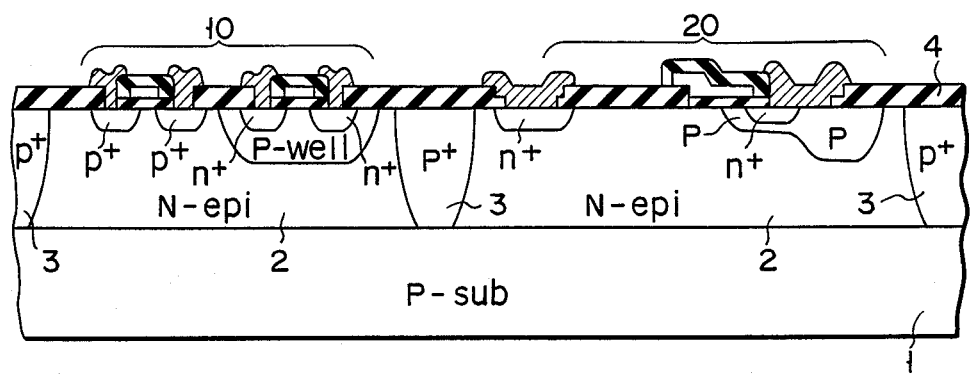
FIG. 1 is a sectional view of a conventional semi-conductor device consisting of a C-MOS and a D-MOS.
Figure 2A:
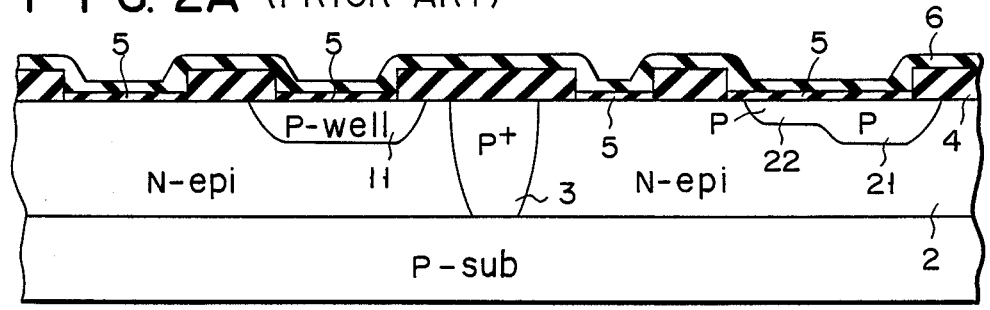
Figure 2B:
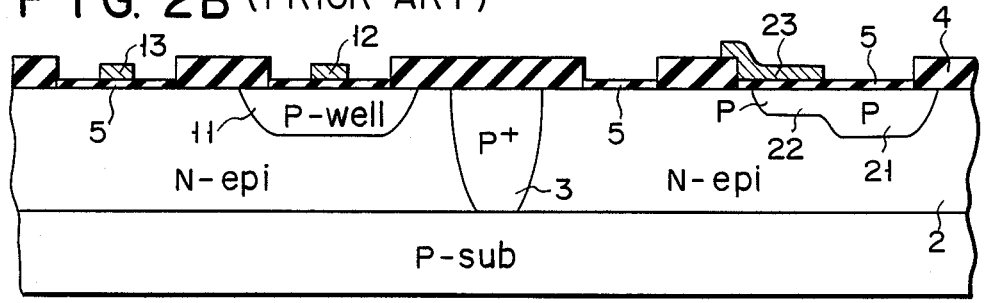
Figure 2C:
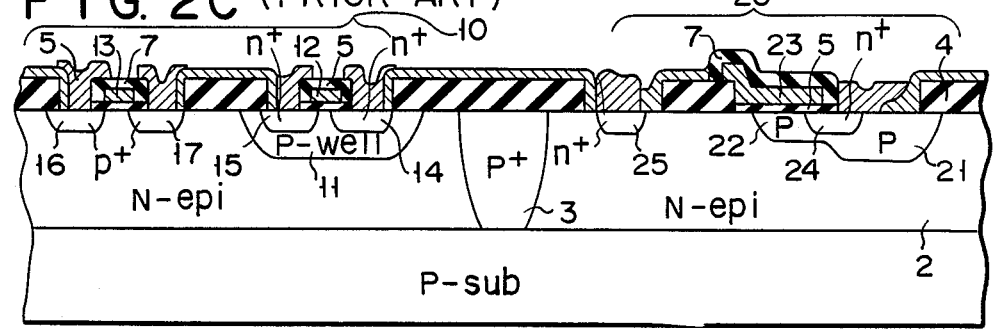

A semiconductor device according to the present invention and a method of manufacturing the same will now be described below.

(1) According to a method performed in a normal bipolar process, N-type epitaxial silicon layer 31 is grown on a P-type silicon substrate and P$^+$-type isolation diffusion layer 6 is formed therein to isolate element regions for C-MOS 101 and D-MOS 201.

Then, a surface of layer 31 is wet-oxidized in an $H_2O$ atmosphere at 1,000° C. to form 5,000 Å-thick thermal oxide film 32 which serves as a mask when a well diffusion layer is formed. Subsequently, photolithography of film 32 is performed to open a P-MOS formation portion and an N-MOS formation portion of the element region of C-MOS 101 and a withstand voltage compensation formation portion of the element region for D-MOS 201. Thereafter, an exposed surface of layer 31 is wet-oxidized in an $H_2O$ atmosphere at 1,000° C. to form 1,000 Å-thick buffer oxide film 33 as a buffer film for ion-implantation (FIG. 4A).

It should be noted that a P-type substrate and an isolation diffusion layer are omitted and only the element regions for C-MOS 101 and D-MOS 201 are shown in FIG. 4A.

(2) As shown in FIG. 4B, the P-MOS formation portion is covered with resist pattern 40a, and then boron is selectively ion-implanted in the N-MOS formation portion and the withstand voltage compensation region formation portion of D-MOS 201 using resist pattern 40a and film 32 as blocking masks. Then, as shown in FIG. 4C, the N-MOS formation portion and the formation region of D-MOS 201 for the withstand voltage compensation region are covered with resist pattern 40b. Phosphorus is selectively ion-implanted in the P-MOS formation portion using resist pattern 40b and thermal oxide film 32 as blocking masks.

Figure 4D:
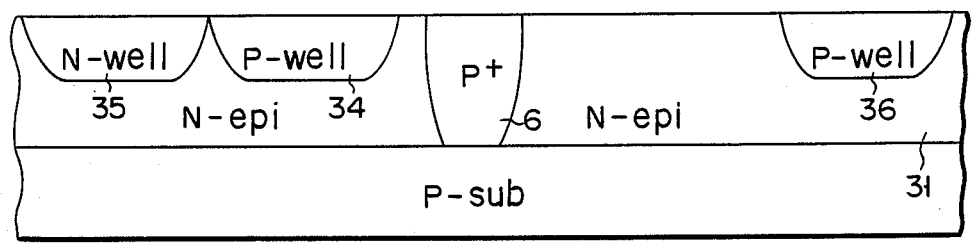
FIG. 4D is a sectional view in which the resist pattern is removed, ion-implanted boron and phosphorus are slumped to form a P-type well diffusion layer for the N-MOS and an N-type well diffusion layer for the P-MOS in the C-MOS element region and to form a P-type well diffusion layer in the D-MOS element region, and then the thermal oxide film and the buffer oxide film are removed.

Then, after removing pattern 40b, annealing is performed in an $N_2$ atmosphere at 1,200° C. for 5 hours to slump the ion-implanted boron and phosphorus. By slumping the above ion-implanted boron and phosphorus, P-type well diffusion layer 34 for the N-MOS and N-type well diffusion layer 35 for the P-MOS are formed in the element region of C-MOS 101, P-type well diffusion layer 36 for compensation of a withstand voltage is formed in the element region of D-MOS 201, and then films 32 and 33 are removed (FIG. 4D).

Figure 4E:
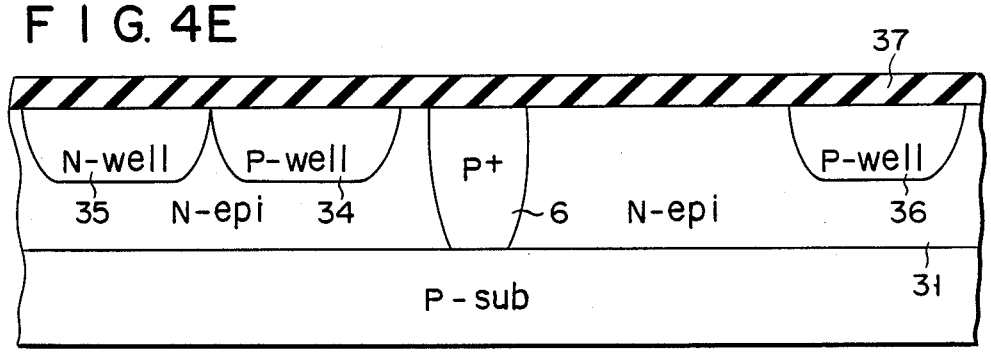
FIG. 4E is a sectional view in which the entire surface of the epitaxial silicon layer is thermally oxidized to form a field oxide film.
Figure 4F:
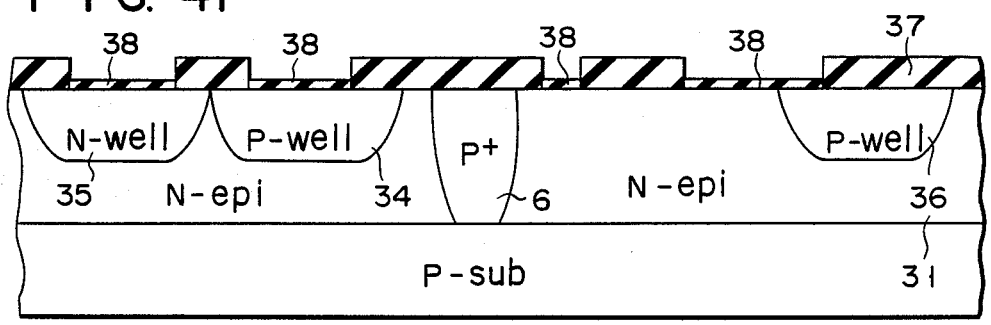
FIG. 4F is a sectional view in which the P-MOS formation portion, the N-MOS formation portion, and the D-MOS formation portion are opened in the field oxide film by photolithography to form a gate oxide film.

(3) The entire surface of layer 31 is wet-oxidized in an $H_2O$ atmosphere at 1,000° C. to form 8,000 Å-thick field oxide film 37, as shown in FIG. 4E.

Subsequently, photolithography of film 37 is performed to open the P-MOS formation portion, the N-MOS formation portion, and the D-MOS 201 formation portion, and then exposed surfaces of the epitaxial silicon layer located at the openings are wet-oxidized in an $H_2O$ atmosphere at 1,000° C. to form gate oxide film 38 (FIG. 3F).

Figure 4G:
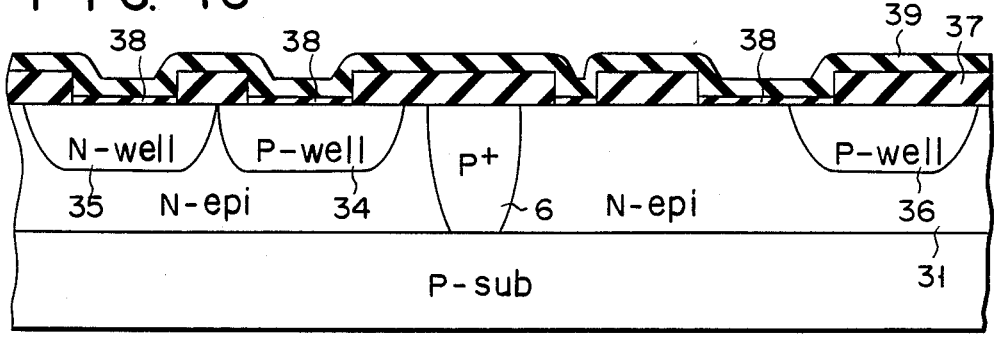
FIG. 4G is a sectional view in which an undoped polycrystalline silicon layer is deposited on the entire surface of the wafer.
Figure 4H:
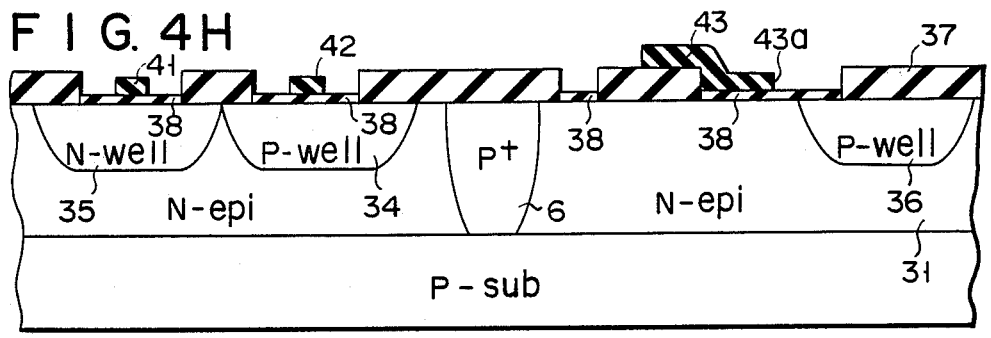
FIG. 4H is a sectional view in which the polycrystalline silicon layer is patterned to form gate electrodes of the C-MOS and the D-MOS.

(4) As shown in FIG. 4G, $SiH_4$ is pyrolytically decomposed by a CVD method at 640° C. to deposit 4,000 Å-thick undoped polycrystalline silicon layer 39 on the entire surface, and then undoped film 39 is patterned to form gate electrodes 41 and 42 of C-MOS 101 and gate electrode 43 of D-MOS 201 (FIG. 4H).

Figure 4I:
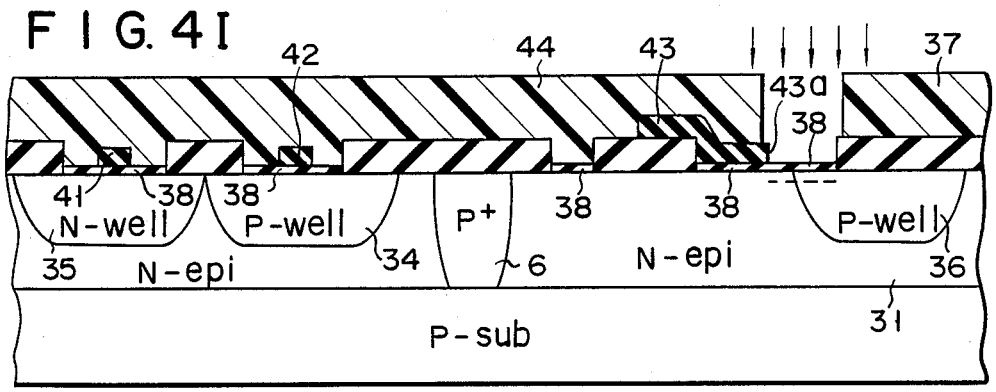
FIG. 4I is a sectional view in which boron is ion-implanted to form a back gate region of the D-MOS using the resist pattern as a mask.

(5) In order to form a back gate region of D-MOS 201, boron is selectively ion-implanted using resist pattern 44, as a blocking mask (FIG. 4I).

As shown in FIG. 4I, an opening of pattern 44 is formed so that end 43a at a source side of gate electrode 43 of D-MOS 201 is exposed. Accordingly, exposed end 43a of electrode 43 serves as a blocking mask for ion-implantation of boron. Boron is not doped in other portions of electrode 43 because they are covered with pattern 44.

Figure 4J:
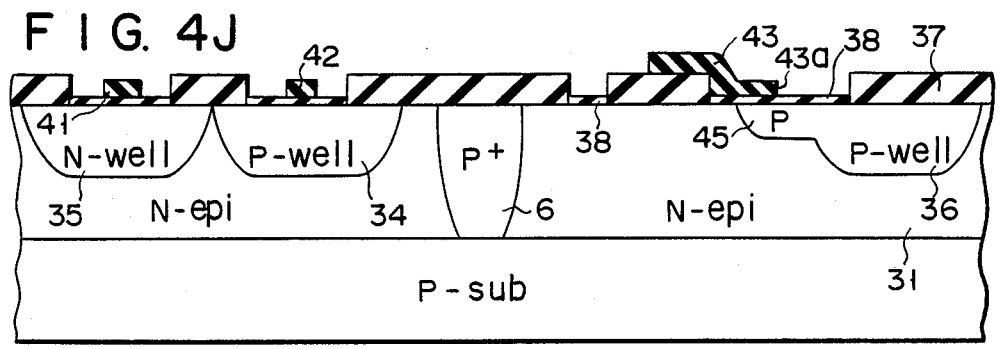
FIG. 4J is a sectional view in which the resist pattern is removed, and then boron is thermally diffused to form a P-type back gate region.

(6) After removing pattern 44, annealing is performed in an $N_2$ atmosphere at 1,200° C. for 2 hours. With this annealing, the ion-implanted boron is thermally diffused to form P-type back gate region 45. Since boron is isotropically diffused by slumping of this annealing, region 45 extends below electrode 43 (FIG. 4J).

Figure 5:
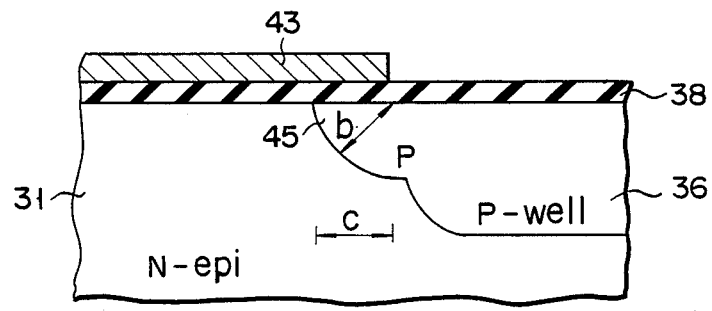
FIG. 5 is a sectional view of a P-type back gate region manufactured by a method of manufacturing a semiconductor device according to the present invention.

As described above, since region 45 is formed by self-alignment, extending length c of region 45 below electrode 43 substantially equals to diffusion length b of boron, as shown in FIG. 5. As is apparent from FIG. 5, each element can be made smaller than in the conventional device, by mask-alignment margin a.

In addition, since gate electrodes 41 and 42 remain undoped and boron contained in electrode 43 is minimal, unlike in the conventional method, an impurity is not diffused to the channel region through film 38, even when annealing is performed at a high temperature of 1,200° C. for 2 hours.

Furthermore, by annealing at a high temperature for a long period of time, polycrystalline silicon layers constituting electrodes 41, 42, and 43 are thermally annealed, and crystal grains grow to reduce a potential barrier of intergranular boundaries, so that a low resistance value is obtained for the polycrystalline silicon layers.

Figure 4K:
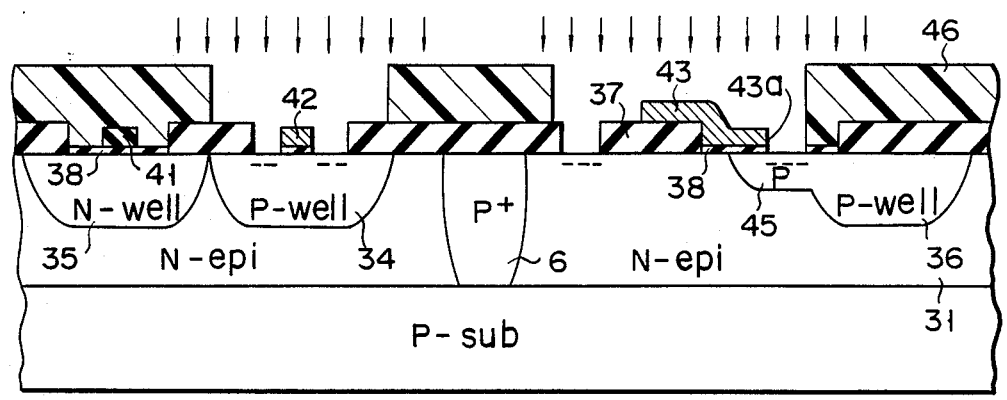
FIG. 4K is a sectional view in which the a resist pattern having opening on the P-type well region of the C-MOS and having opening on the D-MOS is formed, the gate oxide film is removed using the resist pattern, the gate electrode, and the field oxide film as masks, and then arsenic is ion-implanted.

(7) Resist pattern 46 having openings on layer 34 of C-MOS 101 and on D-MOS 201 is formed, and then film 38 is etched by $NH_4F$ using pattern 46, electrode 42, and film 37 as masks. It should be noted that film 37 retains a sufficient thickness because its thickness is larger than that of film 38. Similarly, arsenic is ion-implanted using pattern 46, electrode 42, and film 37 as blocking masks (FIG. 4K).

Figure 4L:
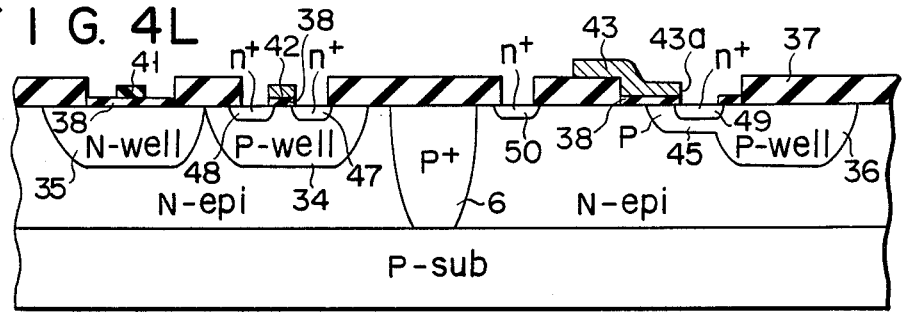
FIG. 4L is a sectional view in which the resist pattern is removed, and then thermal annealing is performed for activating the ion-implanted arsenic to form n+-type source and drain regions of the N-MOS and n+-type source and drain regions of the D-MOS.

Subsequently, pattern 46 is removed, and then thermal annealing for activating the ion-implanted arsenic is performed in an $N_2$ atmosphere for 30 minutes to form n$^+$-type source and drain regions 47 and 48 of the N-MOS and n$^+$-type source and drain regions 49 and 50 of D-MOS 201 (FIG. 4L). By the above thermal annealing, arsenic is doped in electrodes 42 and 43, and a polycrystalline silicon layer constituting these electrodes becomes n-type and has a low resistance. In addition, since the gate electrode is formed to have a low resistance by thermal annealing, the gate electrode obtains a sufficient conductivity by arsenic doping. Thus, the surface channel type N-MOS and D-MOS 201 are formed.

Figure 4M:
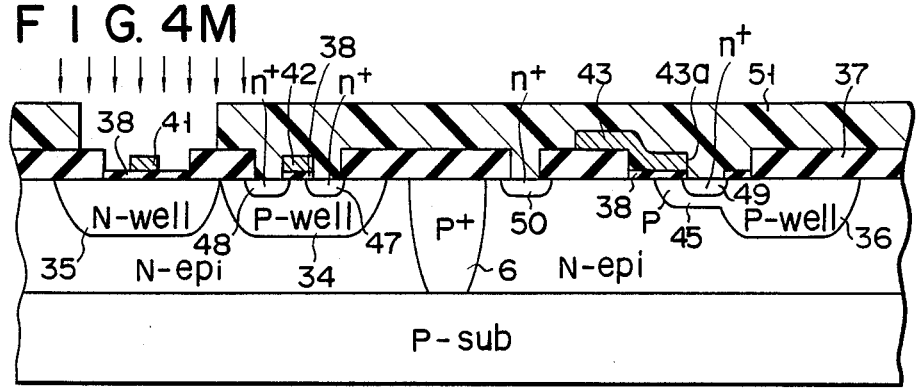
FIG. 4M is a sectional view in which a resist pattern having an opening on the N-type well region is formed, and then boron is ion-implanted in the N-type well region using the resist pattern, the gate electrode, and the field oxide film as blocking masks.

(8) As shown in FIG. 4M, resist pattern 51 having an opening on layer 35 is formed, and then boron is ion-implanted in layer 35 using pattern 51, electrode 41, and film 37 as blocking masks.

Figure 4N:
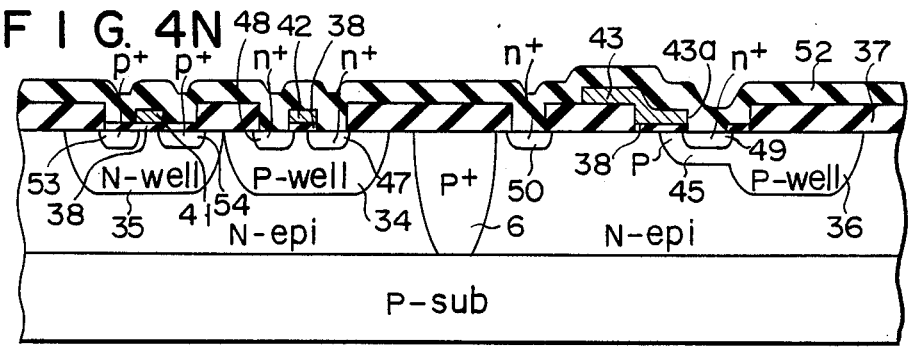
FIG. 4N is a sectional view in which the resist pattern is removed, a CVD-SiO$_2$ film is deposited on the entire surface of the wafer, and at the same time, the ion-implanted boron is diffused and activated by annealing in steps of forming and annealing the CVD-SiO$_2$ film to form p+-type source and drain regions of the P-MOS.

Subsequently, after pattern 51 is removed, CVD-SiO₂ film 52 is deposited on the entire surface as an insulating interlayer. By annealing in an annealing step after deposition step of film 52, the ion-implanted boron is diffused and activated to form p⁺-type source and drain regions 53 and 54 of the P-MOS (FIG. 4N).

Boron is doped in electrode 41 is this step and the polycrystalline silicon layer constituting electrode 41 becomes p-type. In addition, since annealing has already been performed, conductivity that is sufficient for the gate electrode can be obtained by boron doping. Thus, the surface channel type P-MOS is formed.

Figure 4O:
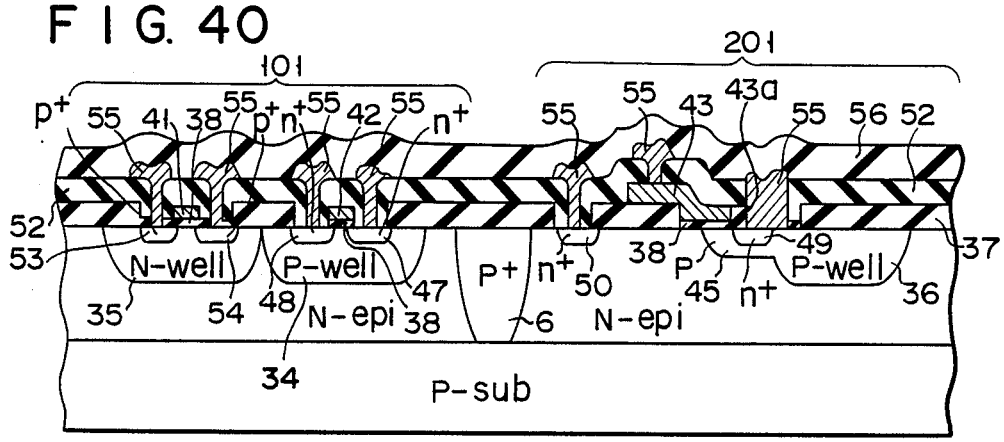

(9) A contact hole is opened according to a normal process, and then aluminum is deposited and patterned to form Al wiring 55. In addition, phosphosilicate glass film 56 is deposited on the entire surface as a passivation film to complete the device (FIG. 4O).

As described in the above steps, in the present invention, both gate electrodes of C-MOS 101 and D-MOS 201 consist of a polycrystalline silicon layer of a conductivity type opposite to that of the channel region. For this reason, none of the MOS transistors need to be of a buried channel type, and a very low threshold voltage can be obtained by those of a surface channel type. In addition, in the above embodiment, since a well structure of a twin tub system is adopted for C-MOS 101, substrate region concentration in both the P-MOS and the N-MOS can be freely set, and the characteristics can be controlled. This can decrease the concentration of N-type epitaxial silicon layer 31 so that a withstand voltage of D-MOS 201 is improved. In addition, the twin tub system can reduce a distance between the P-MOS and the N-MOS, thereby contributing to micropatterning of the elements.

In the manufacturing method of the above embodiment, micropatterning is possible because P-type channel region 45 of D-MOS 201 is formed by self-alignment. As a result, packing density is improved and an ON resistance of D-MOS 201 is reduced by a reduction in an amount of a channel length. This can improve the characteristics such as high speed operation and can reduce the concentration of layer 31 together with the twin tub system of C-MOS 101, thereby improving the withstand voltage. Furthermore, the characteristics of C-MOS 101 (especially P-MOS) and micropatterning are not adversely affected at all.

Figure 6:
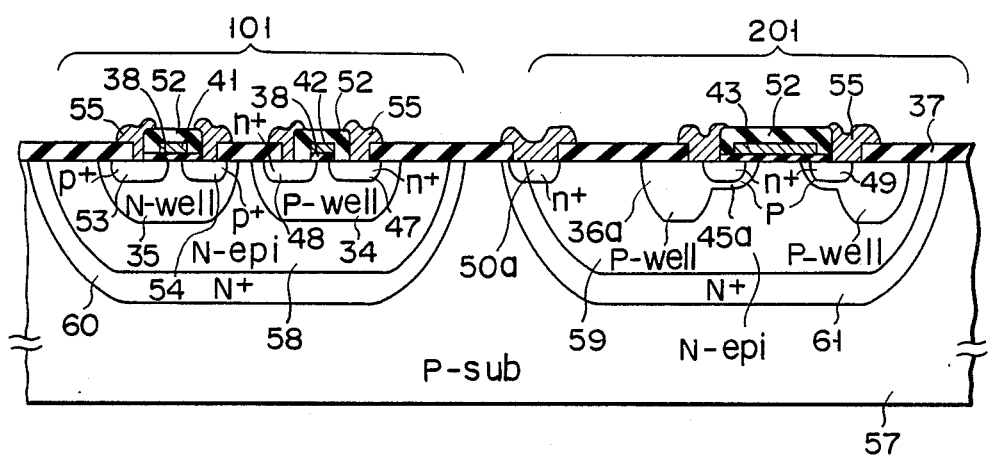
FIGS. 6, 7, 8, and 9 are sectional views of semiconductor devices formed by another embodiment of the method of manufacturing a semiconductor device according to the present invention.

FIG. 6 shows another embodiment in which element isolation of a so-called "efill epitaxial growth structure" is adopted, and D-MOS 201 is formed vertically. In FIG. 6, two element regions 58 and 59, obtained by burying an N-type epitaxial silicon layer in a recess formed by isotropic etching, are formed in an element formation portion of P-type silicon substrate 57. Regions 58 and 59 are electrically isolated from each other by p-n junctions between regions 58 and 59 and substrate 57 interposed therebetween. Respective element regions 60 and 61 are surrounded by N⁺-type buried regions and 61. C-MOS 101 having the same structure as that of the first embodiment shown in FIGS. 4A to 4O is formed in region 58. Vertical D-MOS 201 is formed in region 59. In D-MOS 201, p-type well region 36a for compensation of the withstand voltage, P-type back gate region 45a, and N⁺-type source region 49a are formed concentrically in an annular manner, and gate electrode 43 is formed across annular back gate channel region 45a. n⁺-type drain region 50a is connected to region 61. The other structure is substantially the same as that of the first embodiment shown in FIGS. 4A to 4O, i.e., gate electrodes 41, 42, and 43 of C-MOS 101 and D-MOS 201 consist of a polycrystalline silicon layer which is formed so as to have a low resistance by an impurity of a conductivity type opposite to that of the channel regions, and all the MOS transistors are of a surface channel type.

The semiconductor device according to the embodiment shown in FIG. 6 is manufactured as follows. First, element regions 58 and 59 of the "refill epitaxial growth structure" are formed by a known method. That is, isotropic etching is selectively performed on a surface of P-type silicon substrate 57 to form a recess at a portion which serves as an element region, using SiO₂ as a mask. An n-type impurity such as phosphorus is diffused in high concentration from a surface of the recess to form N⁺-type buried regions 60 and 61.

Then, after moving SiO₂, an N-type epitaxial silicon layer is selectively epitaxially grown in the recess surface by decomposition of SiCl₄, and the surface is polished to obtain a flat mirror surface. After the "refill epitaxial growth structure" element region is formed in the above manner, the semiconductor device shown in FIG. 6 can be manufactured by substantially the same process as that of the embodiment shown in FIGS. 4A to 4O. It is a matter of course that patterns of P-type well region 36a for compensation of the withstand voltage, P-type back gate region 45, n⁺-type source region 49a, and gate electrode 43a of D-MOS 201 are different.

As described above, the withstand voltage of D-MOS 201 can be improved and a high current output can be obtained because it is formed vertically. N⁺-type buried region 61 in the refill epitaxial growth structure reduces drain resistance and ON resistance. For this reason, the concentration in N-type epitaxial silicon layer 59 can be reduced to improve the withstand voltage.

Figure 7:
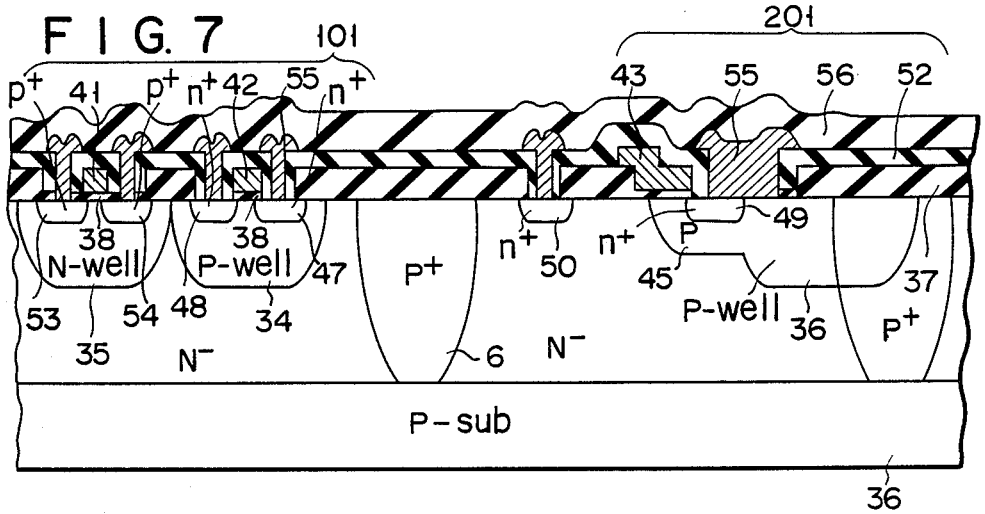

FIG. 7 shows still another embodiment of the present invention in which a D-MOS is an open drain type. That is, a source back gate region in the same structure as that of the embodiment shown in FIGS. 4A to 4O is short-circuited to the underlying substrate by the same diffusion as that used for element isolation. Although the source potential is always short-circuited to GND, the withstand voltage can be improved.

Figure 8:
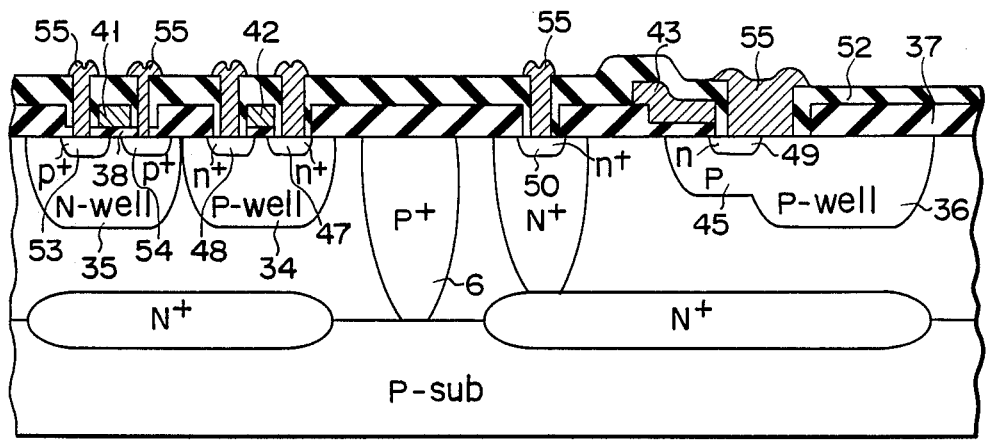

FIG. 8 shows still another embodiment of the present invention in which a buried layer is used. With this structure, ON resistance of the D-MOS can be reduced and latch-up amount of the C-MOS can be increased.

Figure 9:
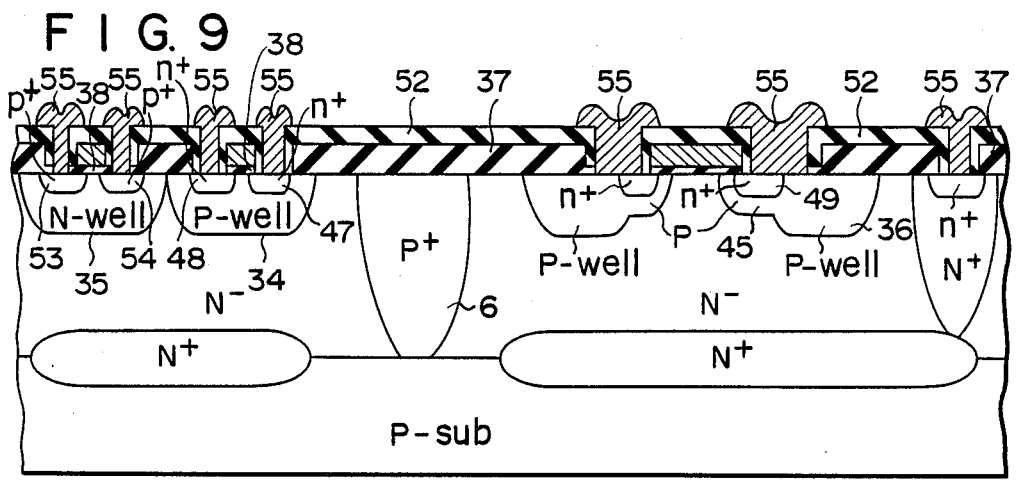

FIG. 9 shows still another embodiment of the present invention in which the above structure is adopted and the same buried layer is used to obtain a vertical D-MOS. In this case, $V_{DSS}$ of the D-MOS can be improved.

What is claimed is:
1. A semiconductor device comprising:
   at least a first element region and a second element region of a second conductivity type formed so as to be electrically isolated from each other on a semiconductor substrate of a first conductivity type;
   a complementary MOS transistor in which an N-channel MOS tranistor and a P-channel MOS transistor are respectively formed in a first well diffusion layer of the first conductivity type and a second well diffusion layer of the second conductivity type formed in said first element region of the second conductivity type, said second well diffusion layer having an impurity concentration higher than that of said first element region; and a double-diffused MOS transistor including a well diffusion layer of the first conductivity type formed in said second element region of the second conductivity type and a back gate region of the first conductivity type formed so as to be self-aligned with a gate electrode using said electrode as a blocking mask.

2. A device according to claim 1, wherein the conductivity types of the gate electrodes of said N-channel, P-channel, and double-diffused MOS transistors are different from those of the respective well diffusion layers.

3. A device according to claim 1, wherein the respective gate electrodes of said N-channel, P-channel, and double-diffused MOS transistors are formed of a polycrystalline silicon layer.

4. A device according to claim 1, wherein said double-diffused MOS transistor is of a vertical type.

5. A semiconductor device comprising:
a semiconductor substrate of a first conductivity type having at least a first and a second recess;
first and second high concentration buried regions of a second conductivity type formed on surfaces of said first and second recesses formed in said semiconductor substrate of the first conductivity type;
first and second element regions of the second conductivity type respectively formed in said first and second recesses formed in said semiconductor substrate and having an impurity concentration lower than that of said first and second high concentration buried regions;

a complementary MOS transistor in which an N-channel MOS transistor and a P-channel MOS transistor are respectively formed in a first well diffusion layer of the first conductivity type and a second well diffusion layer of the second conductivity type formed in said first element region of the second conductivity type, said second well diffusion layer having an impurity concentration higher than that of said first element region; and a double-diffused MOS transistor including a well diffusion layer of the first conductivity type formed is said second element region of the second conductivity type, a back gate region of the first conductivity type formed so as to be self-aligned with the gate electrode using said electrode as a blocking mask, and wherein the drain region includes said second high concentration buried region.

6. A device according to claim 5, wherein conductivity types of the respective gate electrodes of said N-channel, P-channel, and double-diffused MOS transistors are different from those of the respective well diffusion layers.

7. A device according to claim 5, wherein the respective gate electrodes of said N-channel, P-channel, and double-diffused MOS transistors are formed of a polycrystalline silicon layer.

8. A device according to claim 5, wherein said double-diffused MOS transistor is of a vertical type.

* * * * *